(12) United States Patent
Lubeley et al.

(10) Patent No.: US 12,124,290 B2
(45) Date of Patent: Oct. 22, 2024

(54) TIME-SYNCHRONIZED INPUT AND/OR OUTPUT OF SIGNALS WITH A SELECTABLE SAMPLING RATE

(71) Applicant: dSPACE GmbH, Paderborn (DE)

(72) Inventors: Dominik Lubeley, Paderborn (DE); Marc Schlenger, Paderborn (DE); Paul Gruber, Paderborn (DE)

(73) Assignee: DSPACE GMBH, Paderborn (DE)

( * ) Notice: Subject to any disclaimer, the term of this patent is extended or adjusted under 35 U.S.C. 154(b) by 55 days.

(21) Appl. No.: 17/913,454

(22) PCT Filed: Mar. 26, 2021

(86) PCT No.: PCT/EP2021/057961
§ 371 (c)(1),
(2) Date: Sep. 22, 2022

(87) PCT Pub. No.: WO2021/191428
PCT Pub. Date: Sep. 30, 2021

(65) Prior Publication Data
US 2023/0131079 A1    Apr. 27, 2023

(30) Foreign Application Priority Data
Mar. 27, 2020   (DE) .......................... 102020108631.8

(51) Int. Cl.
*G06F 1/12*   (2006.01)
*G06F 1/06*   (2006.01)

(52) U.S. Cl.
CPC . *G06F 1/12* (2013.01); *G06F 1/06* (2013.01)

(58) Field of Classification Search
CPC ..................................... G06F 1/12; G06F 1/06
See application file for complete search history.

(56) References Cited

U.S. PATENT DOCUMENTS

| 2004/0133370 A1* | 7/2004 | Lavoie | H02J 13/00016 |
| | | | 702/60 |
| 2007/0198240 A1* | 8/2007 | Moriat | G06F 30/331 |
| | | | 703/17 |

(Continued)

FOREIGN PATENT DOCUMENTS

WO   WO 9966377 A2   12/1999

*Primary Examiner* — Zahid Choudhury
(74) *Attorney, Agent, or Firm* — LEYDIG, VOIT & MAYER, LTD.

(57) ABSTRACT

A method for inputting and/or outputting signals having a selectable sample rate in a time-synchronized manner on a group of input and/or output channels of an electronic circuit includes: configuring each channel of the group at a standard sample period; synchronously initiating all the channels of the group at the standard sample period; detecting an entry for a modified sample period $T_{Period}$ of a first channel of the group; detecting a current counter value $T_{Counter}$; configuring the first channel at the modified sample period; establishing a waiting time of $T_{Waiting}$ clocks in accordance with $T_{Waiting} = T_{Period} - \mathrm{mod}(T_{Counter}, T_{Period})$, where $\mathrm{mod}(T_{Counter}, T_{Period})$ denotes the division remainder from the current counter value $T_{Counter}$ and the modified sample period $T_{Period}$; and initiating the first channel after the waiting time $T_{Waiting}$.

15 Claims, 4 Drawing Sheets

(56) References Cited

U.S. PATENT DOCUMENTS

2016/0330793 A1* 11/2016 Zhuge ..................... G06F 1/12
2017/0116363 A1* 4/2017 Lubeley ................. G06F 30/33

* cited by examiner

TIME-SYNCHRONIZED INPUT AND/OR OUTPUT OF SIGNALS WITH A SELECTABLE SAMPLING RATE

CROSS-REFERENCE TO PRIOR APPLICATIONS

This application is a U.S. National Phase application under 35 U.S.C. § 371 of International Application No. PCT/EP2021/057961, filed on Mar. 26, 2021, and claims benefit to German Patent Application No. DE 10 2020 108 631.8, filed on Mar. 27, 2020. The International Application was published in German on Sep. 30, 2021 as WO 2021/191428 A1 under PCT Article 21(2).

FIELD

The invention relates to a method for inputting and/or outputting signals having a selectable sample rate in a time-synchronized manner, preferably synchronously detected signals, on a plurality of input channels of an electronic circuit.

In this context, a signal can be construed as a continuously or discretely modifiable physical variable such as, in particular, an electrical voltage or a digital value representing an item of information; in TTL technology, for example, an electrical voltage value greater than 2.4 V may represent a logical "true" value as digital information.

BACKGROUND

Electronic circuits having input and/or output channels are often conventionally referred to as I/O circuits. They are used for outputting electrical signals at the pins of the output channels and/or for detecting, at the pins of the input channels, electrical signals being applied thereto, for example as a result of an analog-to-digital conversion, in order to supply the detected signals for further processing, be it on said electronic circuit or on other electronics connected to the circuit.

In this context, a channel can be construed generally as an arrangement of electronic circuits between an input side and an output side that carry out a function assigned to the channel, for example the aforementioned analog-to-digital conversion and/or analog amplification or filtering. At least one side out of the input side and output side can be provided by a pin at which an electrical signal (either analog or digital) is physically applied. Depending on the channel function, the other side may likewise be provided by a pin, for example in an analog amplifier, or by a storage device or a register, for example in a converter which either makes digital values available at the output side or requires them at the input side.

Hardware-in-the-loop (HIL) simulation is a typical and preferred area of application, although the invention is not limited thereto. In this context, control devices, e.g., motor vehicle control devices, undergo a test to ensure they are functioning properly, for which purpose the control device to be tested is connected to a circuit of the type mentioned at the outset in order to impress signals on the control device via the circuit and/or to detect signals from the control device.

For this purpose, the software model of a test environment runs on a simulation environment, for example the simulation of a journey in the case of a motor vehicle. Simulated events are applied to the output channels, e.g., the pins or register of the output channels of the circuit, by electrical signals that represent the events, in order to thus be transmitted to the control device, and/or signals are applied by the control device to the input channels, e.g., the pins or register of the input channels of the circuit, in order to thus be able to be detected and processed in the simulation environment. In this way, a control device can be run in a simulated environment as if it were actually being run in the real environment.

The simulation environment, or simulator for short, is formed, for example, by a real-time computer system having at least one processor that executes the software model. For example, the model can be provided by real-time software or a multiplicity of interacting software tools, which preferably has a graphical user interface and, particularly preferably, is programmed via software objects. The software can include MATLAB, Simulink, or RTI (Real-Time Interface), which belongs to the applicant and forms a connecting link to Simulink, for example. In the aforementioned cases, software objects are programmed, for example, graphically as a block, in particular hierarchically. However, a simulation environment is not limited to using said pieces of software, each of which is stated by way of example. The software model can be run on the simulation environment either immediately after programming or after code generation and compilation.

In addition to the processor circuit, which comprises the at least one processor, the simulation environment often comprises at least one I/O circuit that is connected to the processor circuit and has said input/output channels. In addition, at least one such I/O circuit comprising input and/or output channels can be connected to a circuit comprising a programmable logic device, in particular a field programmable gate array (FPGA), in order to receive signals therefrom or provide signals thereto. The FPGA circuit can in turn be connected to the processor circuit such that the simulation model can be executed in part on the FPGA circuit and in part on the processor circuit. The input/output channels may have switchable sample rates so that signals that change quickly can be measured more frequently than signals that change slowly, for example. A sample rate f can also be expressed in the form of a sample period T corresponding to $T=1/f$.

In particular, a real-time computer system differs from commercially available computer systems in that a predetermined latency is not exceeded, for example between the inputting of a modified sensor signal and the resulting reaction, like the outputting of a modified actuation signal. Depending on the system to be simulated, a maximum latency of, for example, 1 millisecond or less may be required. In particular, a simulation of the drive of an electrical vehicle (eDrive) or a simulation of power electronics places high demands on the speed of the control loop, in particular with maximum permitted latencies in the microsecond range; consequently, real-time simulations are often no longer covered by mere processor models and processor-controlled I/O channels, but rather the time-critical model parts are executed on a freely programmable FPGA circuit. In this case, the FPGA circuit is preferably configured such that different I/O circuits can be connected thereto in a modular manner.

Connections can be provided by direct connections or via interfaces, in particular standard interfaces, a bus, or network interfacing. In the aforementioned preferred application, but also generally in other possible applications, it may be necessary to output a plurality of electrical signals simultaneously over a plurality of channels of the I/O circuit, and/or to further process a plurality of signals simultaneously after detection over a plurality of channels. The problem here is that different latencies or signal propagation times may occur even in channels of the same type and with the same function, because even functionally identical electrical circuits do not have identical latencies, for example due to production spread. In principle, various measures are known for making signals available simultaneously at the pins (the physical connection sites of the channels) or registers/storage devices of a plurality of output channels after the channel function has been executed, for example a digital-to-analog conversion, such as to make signals that are synchronously applied at the pins/registers of a plurality of input channels available for further processing in sync even after the channel function, for example an analog-to-digital conversion, has been executed. For example, the individual channels may be measured during manufacturing and the established latencies may be stored for compensation purposes, as described in EP 3244325 A1.

If, however, an application requires switching between different sample rates of an input or output channel, the synchronism between the various channels according to the prior art is lost, and recorded data from the various channels do not have a constant temporal relationship. Therefore, an as yet unsolved problem arises in particular when the sample period and offset are intended to be modifiable both at the time the simulator is initialized and during the runtime, while retaining the synchronism for all the channels having identical sample periods and offsets.

SUMMARY

In an exemplary embodiment, the present invention provides a method for inputting and/or outputting signals having a selectable sample rate in a time-synchronized manner on a group of input and/or output channels of an electronic circuit. The electronic circuit comprises at least two input channels and/or at least two output channels, a clock generator, and a counter. A channel processes signals at a predetermined sample period. The method includes the successive steps of: a. configuring each channel of the group at a standard sample period; b. synchronously initiating all the channels of the group at the standard sample period, wherein the counter is also initiated; c. detecting an entry for a modified sample period $T_{Period}$ of a first channel of the group; d. detecting a current counter value $T_{Counter}$; e. configuring the first channel at the modified sample period; f. establishing a waiting time of $T_{Waiting}$ clocks in accordance with $T_{Waiting}=T_{Period}-\text{mod}(T_{Counter}, T_{Period})$, where $\text{mod}(T_{Counter}, T_{Period})$ denotes the division remainder from the current counter value $T_{Counter}$ and the modified sample period $T_{Period}$; and g. initiating the first channel after the waiting time $T_{Waiting}$.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following.

DETAILED DESCRIPTION

Exemplary embodiments of the invention provide a method and a device that allow the sample periods to be switched during the runtime of a simulator in a manner that retains the synchronism.

Exemplary embodiments of the invention provide a method for inputting and/or outputting signals having a selectable sample rate in a time-synchronized manner on a group of input and/or output channels, and a device.

A computer-implemented method for inputting and/or outputting signals having a selectable sample rate in a time-synchronized manner on a group of input and/or output channels of an electronic circuit is thus provided, wherein the electronic circuit comprises at least two input channels and/or at least two output channels, a clock generator, and a counter, wherein a channel processes signals at a predetermined sample period, which is preferably determined by a number of clocks of the clock generator. According to the invention, the method comprises the successive steps of:
  a. configuring each channel of the group at a standard sample period,
  b. synchronously initiating all the channels of the group at the standard sample period, wherein the initiation of a channel in particular entails the start of the input or output of signals on that channel,
  c. detecting an entry for a modified sample period $T_{Period}$ of a first channel of the group, wherein the entry is detected in particular by a processor or programmable logic device connected to the electronic circuit,
  d. detecting a current counter value $T_{Counter}$ wherein the current counter value is preferably detected at the same time as the entry is input or immediately thereafter;
  e. configuring the first channel at the modified sample period,
  f. establishing a waiting time of $T_{Waiting}$ clocks in accordance with $T_{Waiting}=T_{Period}-\text{mod}(T_{Counter}, T_{Period})$, where $\text{mod}(T_{Counter}, T_{Period})$ denotes the division remainder from the current counter value and the modified sample period, and
  g. initiating the first channel after the waiting time $T_{Waiting}$, wherein the channel is initiated in particular immediately as soon as the waiting time has elapsed.

An advantage of the invention is that the sample rate of one channel in a multi-channel I/O circuit can be modified while retaining the synchronism and without having to adjust other channels likewise. All the channels having a predetermined sample period, or even a multiple of that period, as a sample rate remain readily in sync. The synchronization method according to the invention can, in principle, be used with any I/O boards, in particular when the circuit of the I/O board is implemented in an FPGA.

In this case, there is also no need to apply a method known by the term "strobing," in which sample period values previously transferred into registers are adopted in sync by one strobe signal for a plurality of channels. A method according to the invention thus has multiple advantages:

i. There is synchronism between different channels, even when the channels have been set to the same sample rate and offset at different times.

ii. Even different channels whose sample periods are integer multiples of each other are automatically in sync with one another.

iii. The handling in the model is simplified: the rates for unmodified channels need not be reset, unlike in strobing.

iv. When setting identical rates or rates in multiples, there is no incorrect intermediate period like in strobing.

v. Rates can be modified more quickly: the rates are merely set, optionally along with an additional offset, without the additional complexity of strobing.

Preferably, the processing of signals by one channel may be delayed by an offset determined by a number of clocks of the clock generator, and the step of detecting an entry for a modified sample period additionally comprises detecting an entry for a modified offset $T_{Offset}$, wherein the modified offset is taken into account when establishing the waiting time in accordance with $T_{Waiting}=T_{Period}-\text{mod}(T_{Counter}, T_{Period})+T_{Offset}$, and wherein $T_{Offset}=0$ is set if no modified offset has been detected.

An offset in particular refers to a constant shift in the measurement or sampling time. In its preferred form, the invention also makes it possible to modify the offset synchronously during the runtime, even with non-equidistant offsets. In addition, new applications are made possible: sample rate-adaptive applications and applications with adaptive sample offsets (adaptive interleaving) can be achieved while retaining the synchronism. For example, if spectra are to be calculated from analog values via a Fourier transform (FFT), the sampling has to be done both exactly equidistantly and at the required sample rate. If signals whose modification rate is too high for the minimum possible conversion duration are to be detected, then via the invention a plurality of channels having different offsets can be recorded in parallel and then processed in combination:

In a preferred embodiment of the invention, at least two input channels receive the same signal, wherein the at least two input channels operate at the same sample period, in particular the shortest possible sample period, and at a first constant offset between adjacent channels. A new constant offset, in particular half the first constant offset, is set when a trigger condition is met. In particular, the trigger condition is met when the difference between two successive measured values of at least one of the input channels exceeds a predetermined threshold value.

In another preferred embodiment of the invention, an input channel is operated at a first sample period and the input channel is configured over to a second sample period, in particular a shorter sample period, when a trigger condition is met. Preferably, the trigger condition is met when the difference between two successive measured values of at least one of the input channels exceeds a predetermined threshold value.

If, to process a signal, the at least two input channels and/or at least two output channels, or the converter modules installed on said channels, require a conversion duration $T_{min}$ of more than one clock, the waiting time is preferably extended by a modified sample period in accordance with $T_{Waiting}=T_{Waiting}+T_{Period}$ if the time difference between the starting time $T_{Counter}+T_{Waiting}$ at the modified sample period and the start time $t_{Sample}$ of the final processing of a signal would drop below the conversion duration $T_{Min}$ in accordance with $T_{Counter}+T_{Waiting}-t_{Sample}<T_{Min}$. Depending on the conversion duration, the waiting time may also be extended by a multiplicity of the new sample periods.

Particularly preferably, the required conversion duration $T_{Min}$ of a channel is stored in a storage device, which is read out in the event of a modification to the sample period for the channel, and the waiting time is extended on the basis of the read-out conversion duration. In particular, the waiting time is extended by a multiplicity n>1 of periods in accordance with $T_{Waiting}=T_{Waiting}+T_{Period}$. The value stored in the storage device can be established on the basis of the type of converter module, for example from a datasheet, or by measuring the individual channel.

Therefore, starting from the counter value at the starting time of the calculation, the time at which the new period would first become active can be established by way of $T_{Counter}+T_{Waiting}$. Preferably, when sampling or detecting an input value, the current counter value of the sampling time is stored as $t_{sample}$ such that once the waiting time has been calculated it is simple to verify whether the last conversion is already complete before the sample rate is switched. If that is not the case, the start of the detection at the new sample period is delayed by one or more full new sample periods such as to ensure the synchronism of the values of all the channels having the same sample period. Other delays, for example a long duration of the calculation of a new waiting time, can also be taken into account by way of a corresponding delay by one or more new sample periods.

If the electronic circuit comprises at least two sub-circuits which each have at least one input channel and/or at least one output channel, a clock line to another sub-circuit, or a distinct clock generator and a counter, the step of synchronously initiating all the channels of the group at the standard sample period preferably comprises synchronizing the distinct clock generators and counters of the sub-circuits beforehand so that all the channels of the group are in sync despite being arranged on a sub-circuit. Methods for synchronizing counters are known per se; for example, in the case of a plurality of interconnected sub-circuits, distinct clock lines can be provided via which a clock generator of one sub-circuit, as the master, prescribes the clock for all the sub-circuits. All the sub-circuits then have the same clock at exactly the same frequency and remain in sync with one another for any length of time. If each sub-circuit has a clock generator, such as in particular a quartz crystal, various methods known per se for synchronizing the clock generators can be used to correct any frequency drift that occurs.

The invention further relates to a real-time computer system comprising an interface circuit having a group of input and/or output channels, wherein the interface circuit comprises at least two input channels and/or at least two output channels, a clock generator, and a counter, wherein a channel processes signals at a sample period determined by a number of clocks of the clock generator, and wherein the processing of signals by one channel can be delayed by an offset determined by a number of clocks of the clock generator. The real-time computer system further comprises a processor and a programmable logic device, wherein the processor is connected to the programmable logic device, wherein the programmable logic device is connected to the interface circuit, and wherein instructions and/or a bit stream for carrying out a method according to the invention are stored on a non-volatile memory of the real-time computer system.

The invention further relates to an interface circuit comprising a group of input and/or output channels composed of at least two input channels and/or at least two output channels, wherein the interface circuit further comprises a clock generator, a counter, a programmable logic device, and a non-volatile memory connected to said logic device, wherein a channel processes signals at a sample period determined by a number of clocks of the clock generator, and wherein the processing of signals by one channel can be delayed by an offset determined by a number of clocks of the clock generator. A bit stream for the programmable logic device, which bit stream configures the programmable logic device to carry out a method according to the invention, is stored on the non-volatile memory.

Preferably, the bit stream of the programmable logic device comprises a sub-configuration that calculates the division remainder, wherein at least two channels of the at least two input and/or output channels use a joint sub-configuration to calculate the division remainder. This allows the sample periods to be switched while requiring fewer resources on the FPGA.

Alternatively, it is preferable if the bit stream of the programmable logic device comprises a sub-configuration that calculates the division remainder, wherein the various possible sample periods are predefined, and wherein, when generating the bit stream, the width of the counter is selected according to the possible sample periods. Since the lowest common multiple of the possible sample periods is selected as the maximum value of the counter, counter overrun does not cause any problems, so a counter having a smaller width can be used.

The invention will now be described in more detail with reference to the drawings, in which like parts are designated by the same reference numerals. The illustrated embodiments are highly schematic, i.e., the distances and the lateral and vertical dimensions are not true to scale and, unless indicated otherwise, do not have any derivable geometric relationships to each other either.

Figure 1:
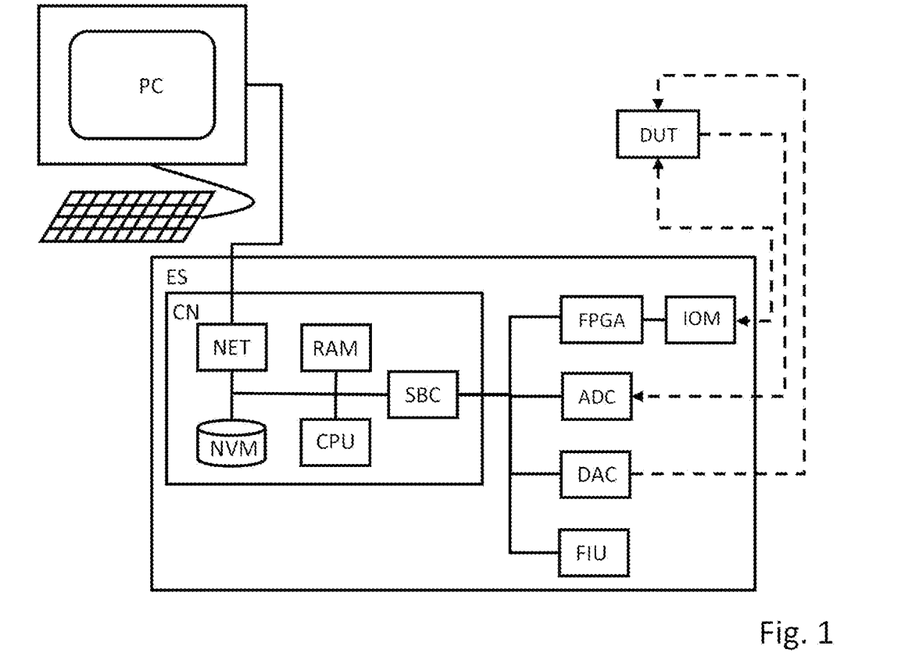
FIG. 1 is a schematic view of an example hardware-in-the-loop test environment.

FIG. 1 schematically shows an example hardware-in-the-loop test environment, comprising an operator computer PC, a simulator ES, and a control device DUT to be tested. The operator computer PC can be configured as a commercially available personal computer having a monitor, input devices, and one or more network interfaces.

The real-time simulator ES comprises a computing node CN, which is connected to the operator computer PC via a network interface NET. The computing node CN has at least one processor CPU, in particular a multi-core processor, a main memory RAM, and a non-volatile memory NVM, which preferably stores an operating system and/or a bootloader. A logic board having a programmable logic device FPGA, two I/O circuits ADC, DAC, and an error simulation circuit FIU are connected to the computing node via a high-speed bus SBC or a corresponding controller. The programmable logic device FPGA is preferably freely programmable and can be configured in accordance with the present invention. The simulator ES can also have a plurality of logic boards or a plurality of programmable logic devices FPGA on a logic board. The logic board preferably has one or more slots for I/O modules. Also shown is an I/O module IOM, which is connected to the control device DUT to be tested and can, for example, exchange digital input and output signals therewith. The I/O circuit ADC has one or more analog-to-digital converters, which receive(s) analog signals of the control device DUT to be tested. Via the I/O circuit DAC, which has one or more digital-to-analog converters, the simulator ES can output analog signals to the control device DUT to be tested. The error simulation circuit FIU can apply defined electrical errors, for example a short-circuit of two channels, to connected devices.

Freely programmable logic devices FPGA are used in particular for applications such as eDrive and power electronics because particularly fast control loops occur in those fields. Expediently, logic boards comprising an FPGA of this kind have a plurality of slots for I/O modules; for example, dSPACE markets the DS6601 FPGA Base Board having five slots that can be equipped with different I/O modules. By fitting a new I/O module, for example, an existing test environment can be expanded with high-resolution analog-to-digital conversion. I/O modules may also have different channels, for example the DS6651 multi-I/O module, which in each case has six analog input and output channels having 16-bit resolution and 16 digital input and output channels. If five DS6651 modules are operated on a logic board, then in each case up to 30 analog input channels and 30 analog output channels have to operate in sync. "Operate in sync" should preferably be construed to mean that all the input and/or output channels precisely sample at the same clock flank of a joint clock (or trigger the conversion) and thus, for example, provide a time resolution of 8 ns.

Since the sample rates are adjusted in sync using a method according to the invention, there is no need to operate at a single fixed sample rate; rather, the sample rate, and additionally an offset, can be adjusted as often as desired, although all the channels in use on the I/O modules on an FPGA base board operate exactly in sync with the clock again as soon as the same sample rate and the same offset are set again for these used channels at a later time.

At the same time, the sample rate and offset are modified more quickly and thus in a highly variable manner, as a result of which sample rate-adaptive applications and applications with adaptive sample offsets (adaptive interleaving) can be implemented while retaining the synchronism. Interleaving refers to a measurement method in which a plurality of channels record the same signal at different offsets, thereby allowing the signal to be measured with greater time resolution at short equidistant offsets. Whereas typical 16-bit ADCs have a minimal sample period or conversion duration of, for example, 200 ns, the offset can be shifted by individual clock periods of in particular 8 ns. A DS6601 FPGA Base Board having five DS6651 modules allows for a sampling sequence of 30 measurements in a raster down to 8 ns, thereby enabling ongoing sampling at up to 8 ns/125 MHz while using 25 ADCs, at a minimal sample period of 200 ns. Depending on requirements, the offset can be adaptively shifted using the method according to the invention. This, for example, allows the time resolution to be adapted by setting multiples of 8 ns as offsets. Owing to the method according to the invention, a measurement need not be restarted after each sample rate modification. In addition, non-equidistant offsets are possible, as a result of which selected signal ranges can be sampled at a higher resolution than the others, for example.

Figure 2:
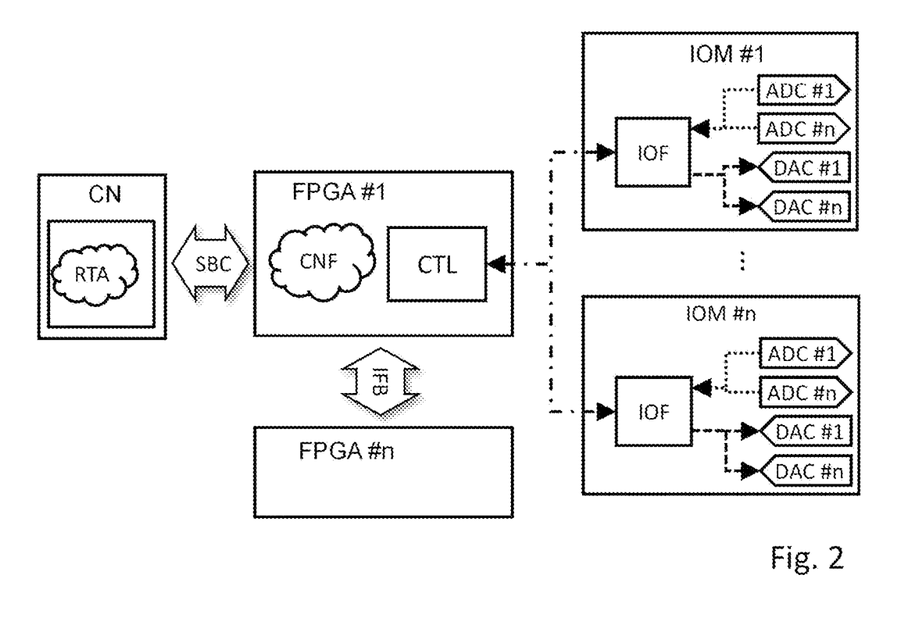
FIG. 2 is a schematic view of a simulator comprising synchronized I/O modules or sub-circuits and synchronized input and output channels.

FIG. 2 is a schematic view of a simulator comprising synchronized I/O modules or sub-circuits and synchronized input and output channels. A real-time application RTA is executed on the computing node CN and, for example, comprises a less time-critical sub-model. Via a high-speed bus SBC, a logic board is coupled to a programmable logic device FPGA #1 which can be freely programmed at least in part. Further freely programmable logic devices can be connected via an internal bus FB of the logic board; in this case, a second programmable logic device FPGA #n is shown by way of example. At least one first partition of the logic device FPGA #1 is configured using a configuration CNF, which in particular comprises a time-critical sub-model. The configuration CNF can in particular be created on the basis of a graphical model and be installed at the start of a simulation. An I/O bus controller CTL can be implemented on a second partition, various I/O modules being connected via said controller.

Shown by way of example are a first I/O module IOM #1 and a second I/O module IOM #n, which are connected to the freely programmable logic device FPGA #1 via the I/O bus. On each of the I/O modules there is arranged a programmable logic device IOF, two analog-to-digital converters ADC #1, ADC #n, and two digital-to-analog converters DAC #1, DAC #n. As shown, the I/O modules would thus provide two analog input channels and two analog output channels. In principle, the number of available channels may be increased using further modules; only two are shown here for the sake of clarity.

The figure shows synchronized I/O channels by way of identical connection lines, a distinction being drawn between analog input channels ADC (dotted connection line) and analog output channels (dashed connection line) as two distinct synchronization domains. A connection between synchronized I/O modules and the central logic device FPGA is shown as a dash-dot connection line. In principle, input and output channels may also be merged in a joint synchronization domain. As soon as the synchronization steps (to be described below) are carried out (in particular the fourth step), an analog input value is sampled by the analog-to-digital converter ADC at the same clock as the transfer to the digital-to-analog converter DAC of the numerical value that is to be output. This can be referred to as converter synchronism since the signals are applied to the converter in sync. However, there is no synchronism at the pin via which the control device to be tested is connected, the reason being that a value that is to be output is not output by the DAC as an analog signal at the pin until after a conversion duration of, for example, 96 ns. Using the method according to the invention, the pin synchronism can be achieved in a simple manner by setting the conversion duration that is specified by the converter type, and is thus known, as the offset of the relevant channel. This makes it possible to freely select between converter synchronism and pin synchronism.

Figure 3:
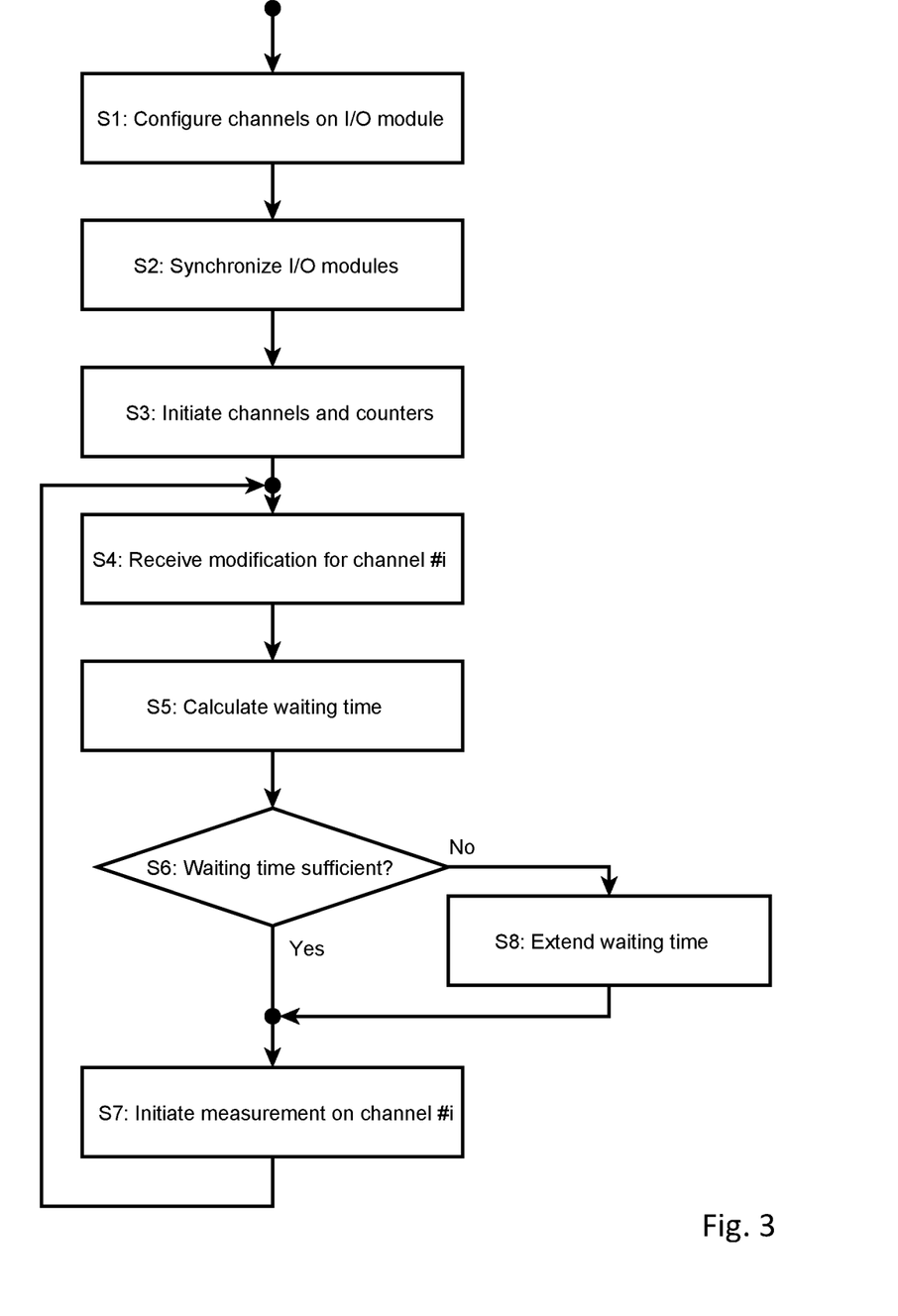
FIG. 3 is a schematic flowchart of a method according to the invention.

FIG. 3 shows a schematic flowchart of a method according to a preferred embodiment of the invention, in which the sample times of all the analog channels are synchronized in a plurality of steps.

In step S1 (Configure channels on I/O module), which is expediently carried out by the logic device IOF arranged on the I/O module, all the analog input and/or output channels arranged on the module are configured at a predetermined starting value for the sample rate or at a standard sample period and a predetermined starting value for the offset. The starting value for the offset can in particular be 0 or a value that is constant for all the converters of one type. If, for example, analog-to-digital converters ADC of an I/O module require longer for the conversion than the digital-to-analog converter DAC of the I/O module, the difference between the conversion durations can be predetermined as the standard offset of the DAC in order to achieve pin synchronism. If a plurality of I/O modules are connected to a central logic device FPGA, the channels of all the I/O modules are preferably pre-configured such that the sample rates and offsets of all the ADCs and DACs of the analog channels are initially set. In particular, after a simulator is reset or initiated the logic devices IOM of the I/O module may retrieve and apply stored default settings, for example the fastest sample rate possible with the converter in question and an offset of 0 for all the input and/or output channels arranged on the I/O module.

In step S2 (Synchronize I/O modules), all the I/O modules connected to the central, freely programmable logic device via the I/O bus are synchronized. In the process, even I/O modules of different types or having different channel equipment may be synchronized. Preferably, the individual I/O modules synchronize themselves with the central logic device FPGA. For example, the I/O bus can be configured as a low-voltage differential signaling (LVDS) interface having a plurality of lanes. The synchronization of a plurality of I/O modules via an LVDS connection can be carried out such that, once the LVDS section has been trained, the offsets of the individual lanes are shifted with respect to one another until all the lanes of all the I/O modules are synchronized. In principle, it is also possible to use any other method known per se that allows a plurality of programmable logic devices to be synchronized with one another.

In step S3 (Initiate channels and counters), all the analog channels are initiated in sync at the configured sample rates and offsets. In addition to the fact that all the analog channels of all the I/O modules are initiated in sync at the configured sample rates and offsets, in each case a counter instanced on the logic device IOF of each I/O module is initiated. Since this counter limits the resolution of the synchronization, it preferably has the full clock applied to it and thus counts in a precisely coordinated manner. To prevent the counter overrunning before the end of a predetermined guaranteed runtime of the real-time simulator, the counter preferably has a 56-bit width, corresponding to 18.3 years for a clock period of 8 ns; in principle, a larger or smaller width may also be used.

In step S4 (Receive modification for channel #i), a modified entry for the sample period and/or offset is received. This entry can be input, for example, by a user of the simulator via an operator interface (to be described below). The real-time application or simulation model may also contain permanently stored entries for a modification to the sample period; in particular, the sampling can be carried out at a higher time resolution when a trigger condition is met.

The starting time for applying the new sample period and/or the new offset now has to be established in order to ensure that all the channels that are using identical sample rates and offsets are sampled in sync; expediently, this may be done on the logic device IOF of the I/O module.

In step S5 (Calculate waiting time), the division remainder $\mod(T_{Counter}, T_{Period})$ for a new sample rate that is to be set is generated from the counter value (number of clocks) and the new sample period (multiple of clocks). The difference between the sample period and the division remainder yields the time remaining in clocks before the sampling is to be initiated so that the position on the sampling raster is the same as if the sampling had been initiated at the time 0 using that sampling raster. If only the offset $T_{Offset}$ has been modified but the sample period remains the same, a remainder of 0 is thus obtained. The sum of this difference and the offset, given as a multiple of clocks, yields the time remaining in clocks before the sampling is to begin at the new rate if an offset of more than 0 has additionally been set. The waiting time $T_{Waiting}$ in clocks until a new sample rate starts can thus be calculated in accordance with $$T_{Waiting} = T_{Period} - \mod(T_{Counter}, T_{Period}) + T_{Offset}$$

In step S6 (Waiting time sufficient?), it is verified whether the waiting time is enough for the converter of channel #i to have already converted the last sampled value. If this is not the case, i.e., the sum of the time since the last sampling at the old rate and the calculated waiting time $T_{Waiting}$ is smaller than the minimum conversion duration, the waiting time has to be extended. For this purpose, in step S8 (Extend waiting time), another period of the new sample rate is added in accordance with $T_{Waiting}=T_{Waiting}+T_{Period}$. This can be done iteratively until $T_{Counter}+T_{Waiting}-t_{Sample}>T_{Min}$, or the waiting time can be directly extended by a plurality of clocks in a manner suitable for the converter in question.

If the waiting time was sufficient or has been extended accordingly, then in step S7 (Initiate measurement on channel #i) the measurement is initiated suitably at the end of the waiting time. All the channels having the same sample period measure in sync, or the measurements have a fixed interval between each other. The method can be continued for the same channel or for any other channel for which a modified sample period and/or a modified offset is received.

Figure 4:
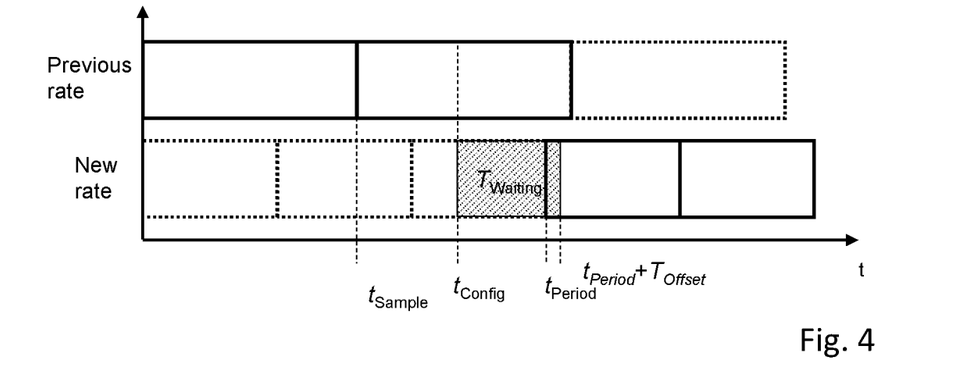
FIG. 4 shows a graph of the variation over time during switching of the sample period.

FIG. 4 shows a graph of the variation over time during switching of the sample period, in which the sampling raster of a measurement at the previous rate and the sampling raster of a measurement at a new rate or a newly set sample period and a desired offset can be seen schematically. Vertical dashed lines represent relevant sampling times. In this case, $t_{Sample}$ denotes the time at which the last sampling of a signal took place at the previous rate. At the time $t_{Config}$, a modified sample period is detected, for example because a user sets a measurement at the new rate. The waiting time $T_{Waiting}$ calculated as per the above formula is shown as a hatched rectangle. The time from which a measurement could be carried out using the new raster is shown as $t_{Period}$. In the example shown, however, an offset $T_{Offset}$ has additionally been set, which results in an accordingly longer waiting time. Here, as elsewhere, it has been assumed that the waiting time is calculated instantaneously; however, a longer calculation time could also be taken into account in the waiting time depending on a conversion duration.

Figure 5:
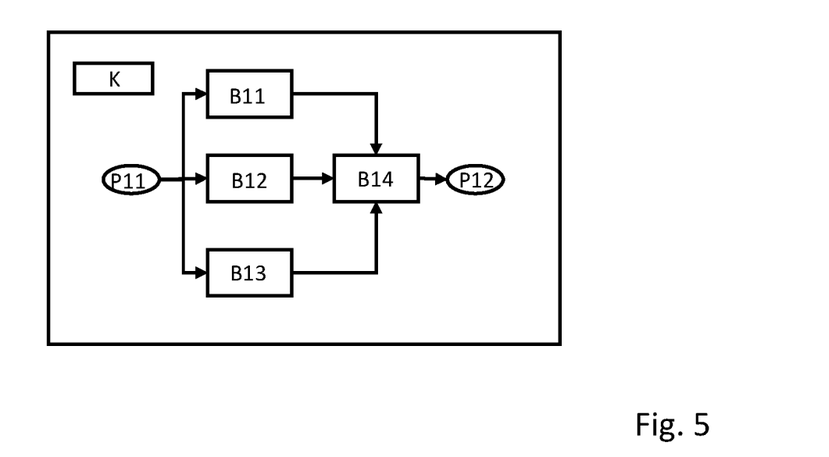
FIG. 5 is a schematic illustration of an example simulation model.

FIG. 5 is a schematic illustration of an example simulation model, in particular of a sub-model to be executed on the freely programmable logic device FPGA. An input port P11, an output port P12, four calculation blocks B11, B12, B13, B14, and a configuration block K are shown. The blocks are connected by signal lines via which data, such as the numerical value of a detected input signal, are exchanged. The simulation model shown can, for example, be depicted and processed on the operator computer PC. For a real-time simulation, code is generated from the simulation model, for example in a hardware description language from which a configuration is generated for the logic device FPGA. In addition, the model may continue to be depicted during the real-time simulation so as to serve as a user interface for displaying and modifying values. Alternatively, a dedicated program for displaying and setting values can also be used during the simulation.

Preferably, there are multiple options for a user of the simulator to set a new sample rate or a new offset for a channel:

The modified sample rate can be set during initialization of the real-time phase by adapting the corresponding parameters of the simulation model and then generating the code for the FPGA configuration. Preferably, the new value for the sample period is transferred to the logic device IOM of the I/O module once the I/O modules have been synchronized (step S2).

Alternatively, the modified sample period may also be set on the representation of the FPGA configuration in the modeling tool for a processor-based real-time application. The new value is transferred to the logic device IOM of the I/O module via the logic board while the real-time application is being initialized by the processor.

During the runtime of the real-time phase, a new value for the sample period and/or a new value for the offset can be set via a port, for example on a model block as a representation of the analog channel. Preferably, the new value for the sample period is received by the freely programmable logic device FPGA via a register interface of the processor model. The value can then be adjusted during the runtime not only by the FPGA model but also by the processor model and thus also using control tools or programs or automation interfaces such as the generic simulator interface XIL API (application programming interface).

Figure 6A:
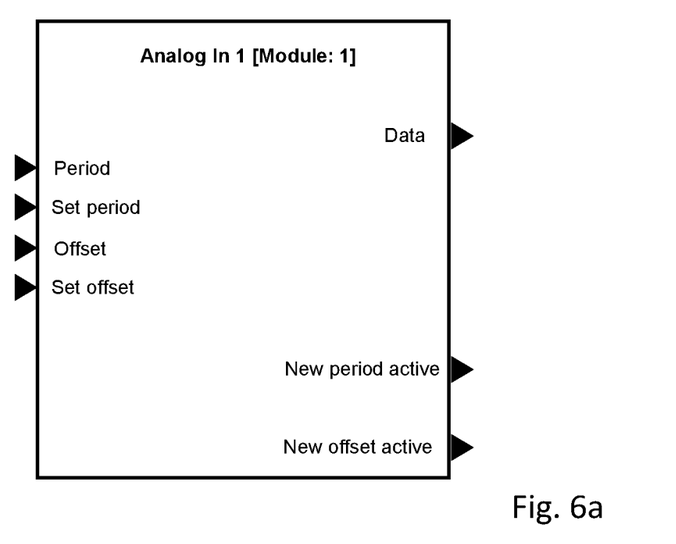
FIG. 6a is a schematic view of a first embodiment example of a user interface that allows the sample period and optional offset to be modified in a simulation model.

FIG. 6a is a schematic view of a first embodiment example of a user interface that allows the sample period and optional offset to be modified in a simulation model. By way of example, an identifier such as Analog In1 [Module: 1] may be specified, which identifies the input or output channel in which the modified sample period and/or the modified offset is set. The block shown comprises inputs for receiving a new period and a new offset. In addition, via the inputs "Set period" and "Set offset," a starting signal for setting a new sample period or a new offset, respectively, can be received. Via the output "Data," the input signal values measured by the analog-to-digital converter can be transferred to other parts of the model. Two further outputs "New period active" and "New offset active" output a signal as soon as a new configuration has been set and the sampling is thus carried out at the new sample period and/or new offset.

Figure 6B:
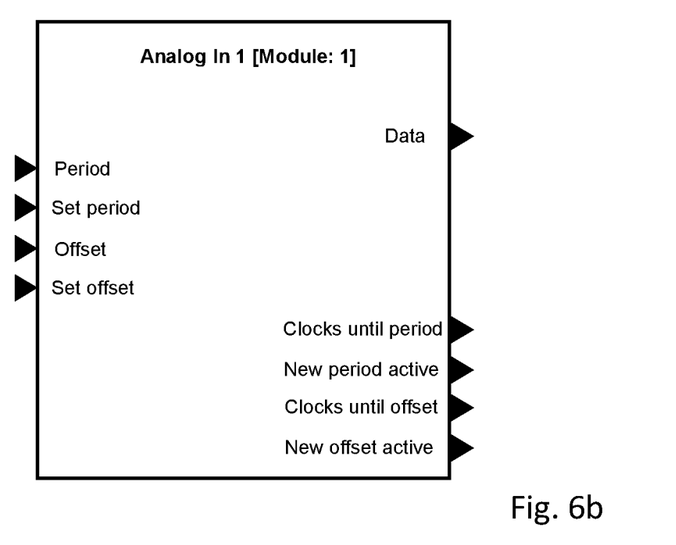
FIG. 6b is a schematic illustration of a second embodiment example of a user interface that additionally indicates, by way of a signal, the time at which a new applied sample rate or offset becomes active.

FIG. 6b is a schematic illustration of a second embodiment example of a user interface, which corresponds to the above-described block but additionally indicates, by way of a signal, the time at which a new applied sample rate or a new offset would become active. Since corresponding mechanisms are implemented for each channel in a VHDL framework for the freely programmable logic device FPGA, said channels offer users various options: for instance, at an FPGA model block representing the corresponding channel, it can be precisely signaled via a port of that block when a sample rate that is to be newly set was adopted in the I/O module. This makes it possible to react thereto directly in the FPGA model or simulation model. At another port, the number of clocks remaining before a sample rate that is to be newly set would be adopted can also be signaled. Preferably, the block may also have a checkbox by which a user can select whether converter synchronism or pin synchronism is applied between the Analog In and Analog Out channels.

To establish a division remainder, division or multiplication by an inverse is required; this may take up lots of space and multiple clocks of computing time in a programmable logic device. For example, it may be necessary to divide a counter value having a 56-bit width by a 32-bit sample period, or to establish the division remainder, whereby 200 ns (25 clocks) to 30 s may in particular be able to be set as the sample period. In accordance with different preferred embodiments, it may not be necessary to implement full division and complexity can be reduced:

In a first embodiment, only powers of two may be permitted as sample periods. In this case, only shifting is required, not division, and this requires just 1 clock and almost no resources, even for the maximum sample period of 32 bits.

In other embodiments, any sample periods are permitted, meaning that division is required, the divider being able to be optimized in different ways:

In a second embodiment, the division is instanced n times in parallel. Even with pipelining in the case of a plurality of channels, a divider is at least 1 clock slower per channel than a parallel configuration. In a trade-off between speed and resource use on the programmable logic device, the divider can be instanced from 1 to n times so that a plurality of channels share one divider.

In a third embodiment, the divider is optimized in order to achieve lower cycle latency: since the required logic and the occurring latency decrease as the number of bits to be processed decreases, the maximum runtime and thus the upper bits of the counter are limited to a greater extent. The bits of the counter can be massively reduced by ensuring that counter overrun does not destroy the synchronism.

In this respect, firstly there is the option to limit the maximum counter value to the lowest common multiple of all the sample rates that can be set. This is expedient if there is only a small number of possible sample periods. As a result, counter overrun is irrelevant since nothing is shifted if the maximum counter value can be divided by all the possible sample periods without a remainder.

Secondly, there is the option to store a $T_{ChannelOverrunOffset}$ (independently of the offset) for each channel. At the time 0, $T_{ChannelOverrunOffset}=0$. To calculate the waiting time for a new sample rate, this $T_{ChannelOverrunOffset}$ has to be additionally added to the counter beforehand $$T_{Waiting}=(T_{NewPeriod}-\text{mod}(T_{Counter}+T_{ChannelOverrunOffset},T_{NewPeriod}))+T_{Offset}$$

For a new sample rate, the division remainder is stored:

$$T_{ChannelRemainder}=\text{mod}(T_{MaxCounterValue}+T_{ChannelOverrunOffset},T_{NewPeriod})$$

Each time the counter overruns, the $T_{ChannelOverrunOffset}$ for each channel is increased by $T_{ChannelRemainder}$ and then reduced so that it itself does not overrun:

$$T_{ChannelOverrunOffset}=\text{mod}(T_{ChannelOverrunOffset}+T_{ChannelRemainder},T_{Period})$$

As a result of the invention, it is possible to retroactively adjust the sample rate and the offset for analog-to-digital converters (ADC) and digital-to-analog converters (DAC) in a real-time system while retaining the synchronism of the respective sampling times of all channels having identical sample rates and offset settings.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. A method for synchronizing channels of a group of input and/or output channels of a plurality of modular input-output (I/O) circuits connected to a field-programmable gate array (FPGA) device, comprising:
   synchronously initiating all the channels of the group of input and/or output channels of the plurality of modular I/O circuits at a standard sampling period;
   configuring at least one channel of the group of input and/or output channels of the plurality of modular I/O circuits to have a different sampling period than at least one other channel of the group of input and/or output channels of the plurality of modular I/O circuits;
   detecting an entry for a modified sampling period $T_{Period}$ for a first channel of the group of input and/or output channels of the plurality of modular I/O circuits;
   detecting a current counter value $T_{Counter}$;
   configuring the first channel for sampling using the modified sampling period;
   establishing a waiting time of $T_{Waiting}$ clock cycles in accordance with $T_{Waiting}=T_{Period}-\text{mod}(T_{Counter},T_{Period})$, where $\text{mod}(T_{Counter},T_{Period})$ denotes the division remainder from the current counter value $T_{Counter}$ and the modified sampling period $T_{Period}$, wherein the established waiting time synchronizes the first channel with a second channel of the group of input and/or output channels of the plurality of modular I/O circuits having a sampling period that is the same as the modified sampling period for the first channel of the group of input and/or output channels of the plurality of modular I/O circuits; and
   initiating a first measurement on the first channel after the waiting time $T_{Waiting}$, wherein the first measurement on the first channel is synchronized with a second measurement on the second channel;
   wherein any two channels of the group of input and/or output channels of the plurality of modular I/O circuits which have a same sampling period are synchronized with one another.

2. The method according to claim 1, wherein the processing of signals by one channel is delayed by an offset corresponding to a number of clock cycles of a clock generator;
   wherein the method further comprises detecting an entry for a modified offset $T_{Offset}$; and
   wherein determining the waiting time takes into account the modified offset in accordance with $T_{Waiting}=T_{Period}-\text{mod}(T_{Counter},T_{Period})+T_{Offset}$.

3. The method according to claim 1, wherein, to process a signal, channels of the group of input and/or output channels of the plurality of modular I/O circuits require a conversion duration $T_{Min}$ of more than one clock cycle; and wherein the method further comprises extending the waiting time based on a time difference between a starting time $T_{Counter}+T_{Waiting}$ for sampling at the modified sampling period and a starting time $t_{Sample}$ for a previous sampling period prior to the modification to the modified sampling period dropping below the conversion duration $T_{Min}$ in accordance with $T_{Counter}+T_{Waiting}-t_{Sample}<T_{Min}$.

4. The method according to claim 3, wherein the required conversion duration $T_{Min}$ of a channel is stored in a storage device and is read out in the event of a modification to the sampling period for the channel; and
wherein the waiting time is extended by a multiple of n modified sampling period(s) in accordance with $T_{Waiting}=T_{Waiting}+n \cdot T_{Period}$, where $n \geq 1$.

5. The method according to claim 1, wherein at least two input channels of the group of input and/or output channels of the plurality of modular I/O circuits receive the same signal, wherein the at least two input channels operate at the same sampling period and at a first constant offset between adjacent channels, and new constant offset is set based on a trigger condition being met.

6. The method according to claim 1, wherein an input channel is operated at a first sampling period and is configured over to a second sampling period shorter than the first sampling period based on a trigger condition being met.

7. The method according to claim 1, wherein the plurality of modular I/O circuits comprises at least two sub-circuits;
wherein each sub-circuit of the at least two sub-circuits has:
at least one input channel and/or at least one output channel,
a clock line to another sub-circuit, or
a distinct clock generator and a counter;
wherein synchronously initiating all the channels of the group of input and/or output channels of the plurality of modular I/O circuits at the standard sampling period comprises synchronizing the distinct clock generators and counters of the sub-circuits.

8. The method according to claim 7, wherein each sub-circuit of the at least two sub-circuits is arranged on a separate field programmable gate array (FPGA) device.

9. The method according to claim 1, wherein the configuration of the FPGA device is rewritten based on a simulation being initialized.

10. The method according to claim 9, wherein the plurality of modular I/O circuits is connected to an operator computer on which a graphical user interface having a graphical depiction of the model to be simulated is executed, and wherein a block is depicted in the graphical user interface for at least one channel.

11. The method according to claim 10, wherein the block is configured to receive signals from the simulated model and/or to output signals to the simulated model via ports;
wherein the ports include:
a port that indicates when an associated channel was initiated at a new sample period;
a port that indicates in how many clock cycles a newly set sample rate will become active; and/or
a port via which an entry is received for an offset of a channel by a number of clock cycles.

12. A non-transitory computer-readable medium having processor-executable instructions stored thereon for synchronizing channels of a group of input and/or output channels of a plurality of modular input-output (I/O) circuits connected to a field-programmable gate array (FPGA) device, wherein the processor-executable instructions, when executed, facilitate performance of the following:
synchronously initiating all the channels of the group of input and/or output channels of the plurality of modular I/O circuits at a standard sampling period;
configuring at least one channel of the group of input and/or output channels of the plurality of modular I/O circuits to have a different sampling period than at least one other channel of the group of input and/or output channels of the plurality of modular I/O circuits;
detecting an entry for a modified sampling period $T_{Period}$ for a first channel of the group of input and/or output channels of the plurality of modular I/O circuits;
detecting a current counter value $T_{Counter}$;
configuring the first channel for sampling using the modified sampling period;
establishing a waiting time of $T_{Waiting}$ clock cycles in accordance with $T_{Waiting}=T_{Period}-\mathrm{mod}(T_{Counter}, T_{Period})$, where $\mathrm{mod}(T_{Counter}, T_{Period})$ denotes the division remainder from the current counter value $T_{Counter}$ and the modified sampling period $T_{Period}$, wherein the established waiting time synchronizes the first channel with a second channel of the group of input and/or output channels of the plurality of modular I/O circuits having a sampling period that is the same as the modified sampling period for the first channel of the group of input and/or output channels of the plurality of modular I/O circuits; and
initiating a first measurement on the first channel after the waiting time $T_{Waiting}$, wherein the first measurement on the first channel is synchronized with a second measurement on the second channel;
wherein any two channels of the group of input and/or output channels of the plurality of modular I/O circuits which have a same sampling period are synchronized with one another.

13. An system, comprising:
a plurality of modular I/O circuits having a group of input and/or output channels;
a counter;
a programmable logic device connected to the plurality of modular I/O circuits, wherein the programmable logic device is configured to:
synchronously initiate all the channels of the group of input and/or output channels of the plurality of modular I/O circuits at a standard sampling period;
configure at least one channel of the group of input and/or output channels of the plurality of modular I/O circuits to have a different sampling period than at least one other channel of the group of input and/or output channels of the plurality of modular I/O circuits;
detect an entry for a modified sampling period $T_{Period}$ for a first channel of the group of input and/or output channels of the plurality of modular I/O circuits;
detect a current counter value $T_{Counter}$ of the counter;
configure the first channel for sampling using the modified sampling period;
establish a waiting time of $T_{Waiting}$ clock cycles in accordance with $T_{Waiting}=T_{Period}-\mathrm{mod}(T_{Counter}, T_{Period})$, where $\mathrm{mod}(T_{Counter}, T_{Period})$ denotes the division remainder from the current counter value $T_{Counter}$ and the modified sampling period $T_{Period}$, wherein the established waiting time synchronizes the first channel with a second channel of the group of input and/or output channels of the plurality of modular I/O circuits having a sampling period that is the same as the modified sampling period for the first channel of the group of input and/or output channels of the plurality of modular I/O circuits; and initiate a first measurement on the first channel after the waiting time $T_{Waiting}$, wherein the first measurement on the first channel is synchronized with a second measurement on the second channel;

wherein any two channels of the group of input and/or output channels of the plurality of modular I/O circuits which have a same sampling period are synchronized with one another.

14. The interface system according to claim 13, wherein the programmable logic device configured to calculate a division remainder according to a sub-configuration; and wherein at least two channels of the group of input and/or output channels are configured to use a joint sub-configuration to calculate the division remainder.

15. The interface system according to claim 13, wherein the programmable logic device configured to calculate a division remainder according to a sub-configuration; and wherein the counter has a width selected according to predefined possible sample periods.

* * * * *